United States Patent [19]

Saint-Oyant et al.

[11] 4,398,261

[45] Aug. 9, 1983

[54] DEVICE FOR MEASURING THE LEVEL OF A VARIABLE SIGNAL WITH LOGARITHMIC CONVERSION

[75] Inventors: Bernard J. Saint-Oyant, Nice; Jean G. Roche, Saint-Laurent du Var, both of France

[73] Assignee: Safare-Crouzet, Nice, France

[21] Appl. No.: 183,809

[22] Filed: Sep. 3, 1980

Related U.S. Application Data

[63] Continuation of Ser. No. 974,089, Dec. 28, 1978, abandoned.

[51] Int. Cl.³ .......................................... H03K 13/02
[52] U.S. Cl. .................................. 364/571; 330/144; 330/278; 340/347 DA; 340/347 M; 73/900
[58] Field of Search ....... 340/347 AD, 347 M, 347 R, 340/15.5 GC; 324/115; 73/631, 900; 330/86, 51, 278, 144; 364/733, 571; 346/154, 33 R, 33 WL, 33 EC, 33 C

[56] References Cited

U.S. PATENT DOCUMENTS 3,919,657  11/1975  Howlett et al. ......... 340/347 AD X
4,078,233  3/1978   Frye .............................. 340/347 AD
4,255,706  3/1981   Soojian .......................... 324/115 X Primary Examiner—T. J. Sloyan
Attorney, Agent, or Firm—Holman & Stern

[57] ABSTRACT

A device for measuring the level of a variable signal delivered by a sensor. It comprises a series of attenuators, receiving the signal from the sensor, a squaring and integrating chain for converting the value of the signal delivered by the attenuators into its root-mean-square value, and a recorder. The attenuations are calibrated in dB. The device comprises an AGC circuit, receiving the output signal from the squaring and integrating chain, for switching the attenuators and controlling the recorder. The output signal from the attenuators is maintained constant.

8 Claims, 8 Drawing Figures

DEVICE FOR MEASURING THE LEVEL OF A VARIABLE SIGNAL WITH LOGARITHMIC CONVERSION

This is a continuation of application Ser. No. 974,089, filed Dec. 28, 1978 and now abandoned.

BACKGROUND OF THE INVENTION

The present invention relates to a device for measuring the level of a variable signal as a function of a given parameter, such as for example time, with logarithmic conversion.

Devices effecting a logarithmic conversion by logarithmic amplifiers are already known. These devices do not always make it possible to obtain the desired accuracy and linearity. In fact, apart from the drift of the gain of the amplifiers as a function of the temperature, they present an error which depends on the level of the signal which is applied to the input of the logarithmic amplifiers. Furthermore, devices provided with a squaring and integrating chain giving the root-mean-square value of the signal to be measured are also known. The error introduced by the squaring and integrating chain also depends on the level of the signal.

It is therefore an object of the present invention to provide a measuring device more accurate and more linear than the presently available devices, particularly for frequencies reaching several tens of kilohertz, and for the case where the signal to be measured has a relatively large crest factor.

To this end, the present invention relates to a measuring device having no logarithmic amplifier and in which the level of the signal applied to the input of the squaring and integrating chain is virtually constant.

SUMMARY OF THE INVENTION

The invention thus relates to a device for measuring, with logarithmic conversion, the level of a variable signal delivered by a sensor, comprising an amplification chain made up of a series of attenuators receiving the signal delivered by the sensor, a squaring and integrating chain for effecting the conversion of the value of the signal delivered by the amplification chain into its root-mean-square value, and a recorder for recording the signal to be measured, wherein the attenuators are calibrated in decibels and the device further comprises an automatic gain control circuit receiving the output signal from the squaring and integrating chain to switch the attenuators in order to maintain constant the output signal from the amplification chain and consequently the input signal from the squaring and integrating chain, the recorder being controlled by the automatic gain control circuit.

The various features of novelty which characterize the invention are pointed out with particularity in the claims annexed to and forming a part of this specification. For a better understanding of the invention, its operating advantages and specific objects attained by its use, reference should be made to the accompanying drawings and descriptive matter in which there is illustrated and described a preferred embodiment of the invention.

DETAILED DESCRIPTION OF THE PREFERRED EMBODIMENT OF THE INVENTION

Figure 1:
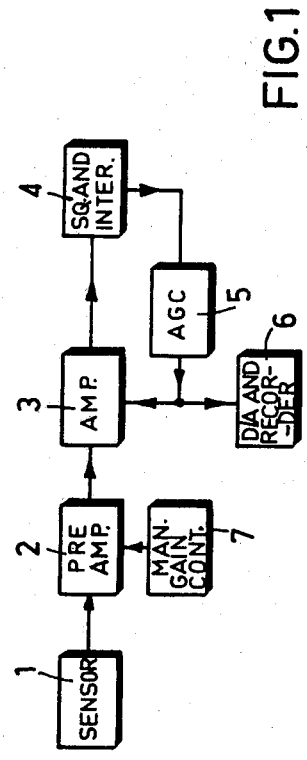
FIG. 1 shows a schematic block diagram of the device of the invention.

Referring now to the drawings, the device of the invention, intended for measuring the level of a variable signal delivered by a sensor 1, comprises a preamplification chain 2, an amplification chain 3, a squaring and integrating chain 4, an automatic gain control circuit 5 and a recorder 6 recording the value of the signal to be measured (FIG. 1).

Figure 2:
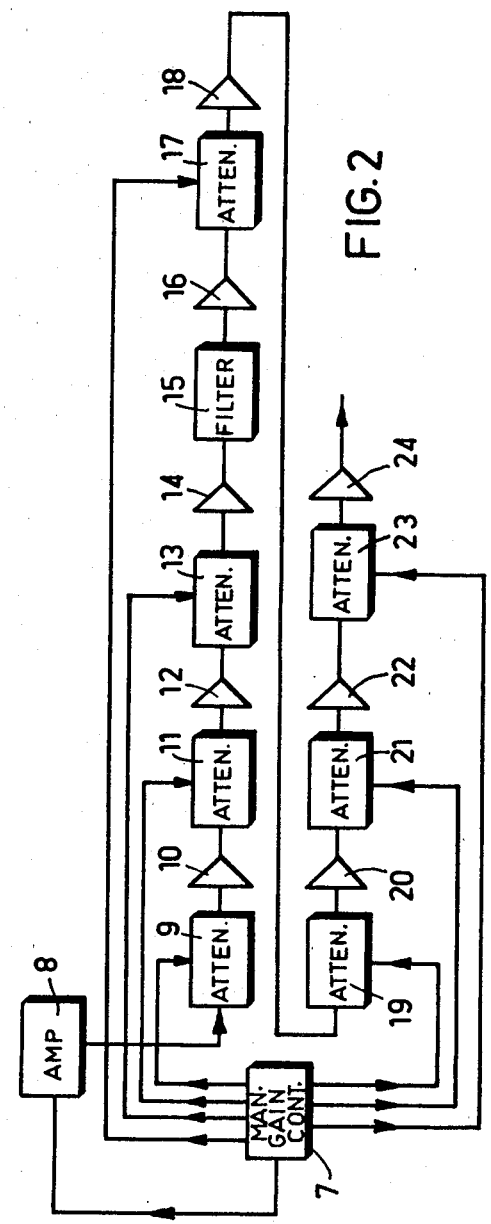
FIG. 2 shows a block diagram of the preamplification chain of the device of FIG. 1.

The preamplification chain 2 (FIG. 2) comprises a first amplifier 8, of gain switchable to one of the two values 20 dB and 0 dB, a first 10 dB attenuator 9, followed by a second 10 dB amplifier 10, a second 10 dB attenuator 11, at the output of the amplifier 10, followed by a third 10 dB amplifier 12, a third 10 dB attenuator 13, at the output of the amplifier 12, followed by a fourth 0 dB amplifier 14, a filter 15 with insertion loss of 6 dB, at the output of the amplifier 14, a fifth 13 dB amplifier 16, at the output of the filter 15, a fourth 8 dB attenuator 17, at the output of the amplifier 16, followed by a sixth 0-dB amplifier 18, a fifth 4-dB attenuator 19, at the output of the amplifier 18, followed by a seventh 0-dB amplifier 20, a sixth 2-dB attenuator 21, at the output of the amplifier 20, followed by an eighth 0-dB amplifier 22, and a seventh and last 1-dB attenuator 23, at the output of the amplifier 22, followed by a ninth and last 13-dB amplifier 24. Apart from the coefficient of attenuation, all the attenuators of the chain 2 are identical. These attenuators, as well as the gain of the amplifier 8, may be switched by a manual gain control circuit 7. The amplifier 8 is of low noise in the frequency band in question, of high input impedance, and of low output impedance, and the variation of its gain may be obtained by switching of a negative feedback resistor (not shown). The output impedance of the amplifier 8 being low, the coefficient of attenuation of the attenuator 9 cannot be affected. The amplifier 14, with a 0-dB gain, is used as impedance separator between the attenuator 13 and the filter 15. The filter 15 as a passive pass-band filter 150 Hz–30 kHz. The amplifier 18 is a linear amplifier, with a 0-dB gain, used as impedance separator between the attenuators 17 and 19; the same applies to the amplifiers 20 and 22.

In the example in question, the signal to be measured may have a frequency within a band extending from 150 Hz to 30 kHz, and an amplitude within a range extending over 120 dB. If, however, the value of this signal had to go beyond the limits of variation allowed by the recorder 6, the manual gain control circuit 7 makes it possible to reduce the gain of the preamplification chain 2, so as to return the signal within the limits of the recorder, without modifying the relative amplitude of the variations, in decibels, of the signal, within these limits.

The range of admissible variation of the mean signal, of 120 dB at the input of the sensor 1, may therefore be returned, in the example in question, to a range of variation of 60 dB on the recorder 6, by the preamplification chain 2.

Figure 3:
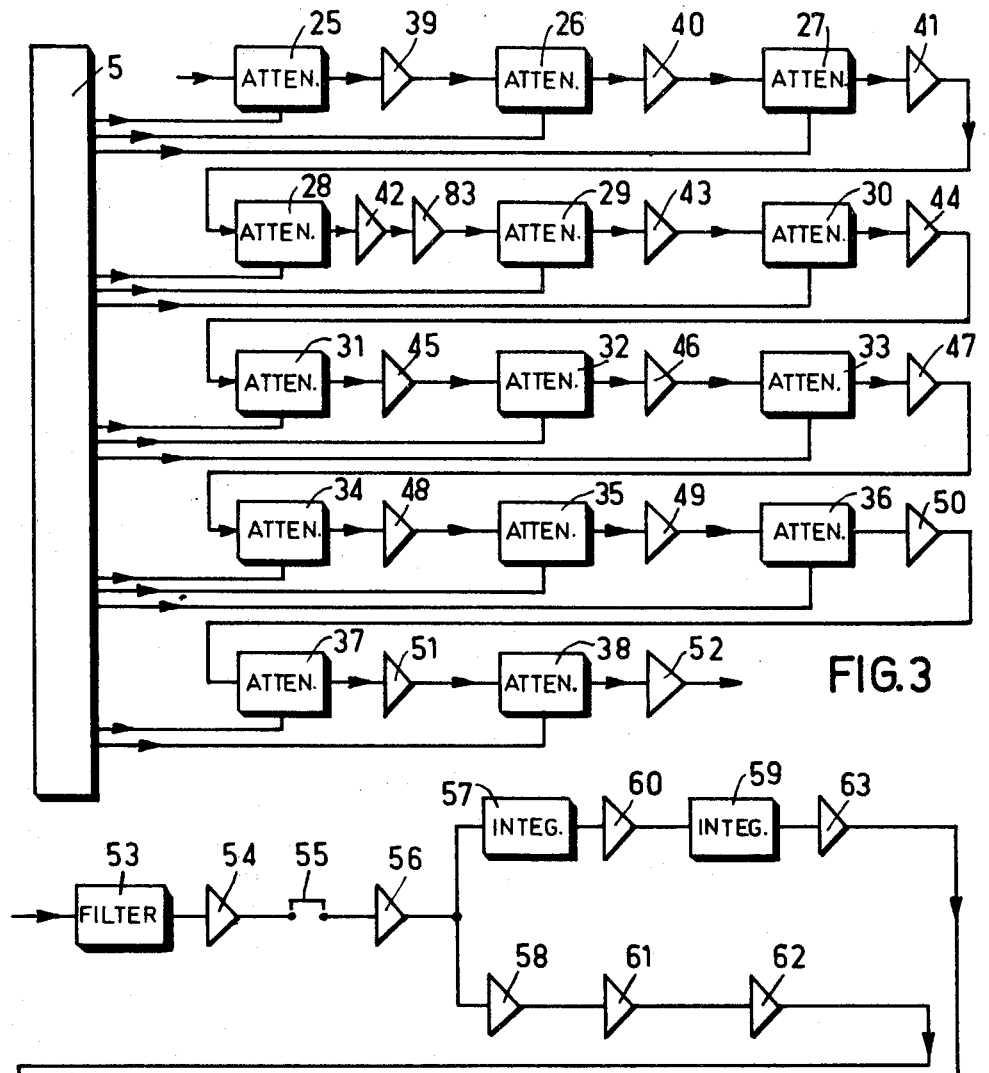
FIG. 3 shows a block diagram of the amplification chain of the device of FIG. 1.

The amplification chain 3 (FIG. 3) which receives the output signal from the preamplification chain 2, comprises attenuators of the same type as those of the preamplification chain 2, and which may be switched by the automatic gain control circuit 5. The chain 3 thus comprises a series of fourteen attenuators 25 to 38, calibrated in dB with respective attenuations of 10 dB, 10 dB, 10 dB, 10 dB, 10 dB, 10 dB, 8 dB, 4 dB, 2 dB, 1 dB, 0.8 dB, 0.4 dB, 0.2 dB and 0.1 dB, connected in two's by a seres of thirteen zero dB gain amplifiers 39 to 51, respectively used as impedance separators. The output of the attenuator 38 is connected to the input of a fourteenth impedance separator amplifier 52 and a fifteenth conventional amplifier 83, with a determined gain, is connected in series between the amplifier 42 and the attenuator 29.

Figure 4:
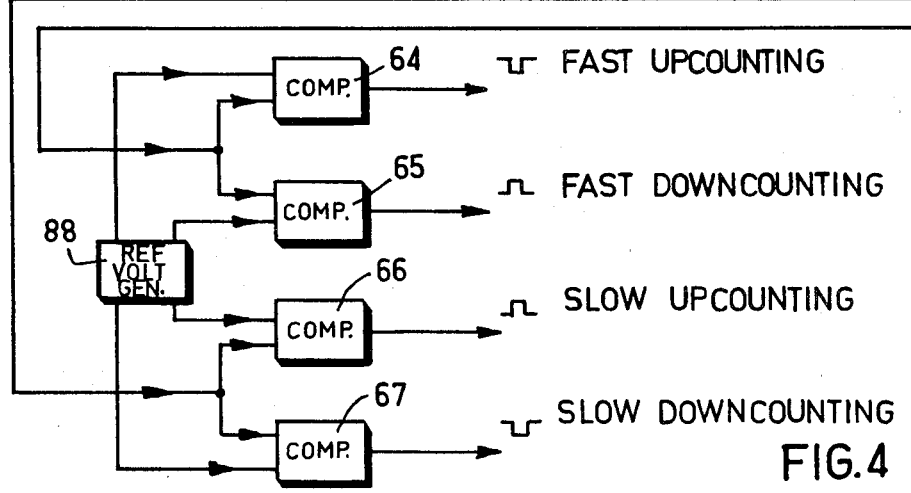
FIG. 4 shows a block diagram of the squaring and integrating chain of the device of FIG. 1.
Figure 5:
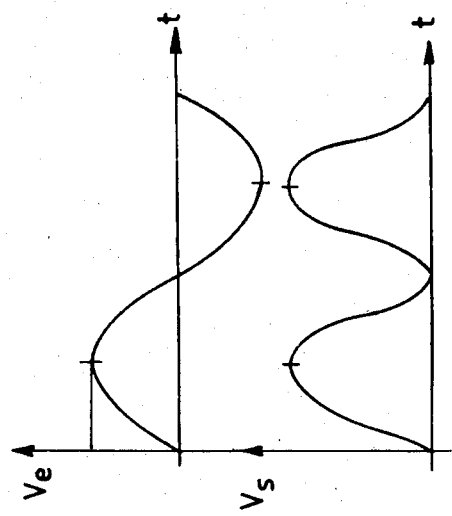
FIG. 5 illustrates the quadratic conversion effected in the chain of FIG. 4.

The squaring and integrating chain 4 (FIG. 4), which receives the output signal from the amplification chain 3, comprises at its input, a filter 53, which is a pass-band filter 150 Hz–30 kHz, with an insertion loss of 6 dB. A linear amplifier 54, with an adjustable nominal gain of 46 dB, is connected to the output of the filter 53, and a jumper 55, at the output of the amplifier 54, makes it possible to isolate the preamplification and amplification chains 2 and 3 from the rest of the device of the invention, in order to effect the servicing controls. A commercially available multiplier 56, used as quadrator, receives the output signal Ve from the amplifier 54, to effect the conversion of the signal Ve into a signal $Vs = Ve^2/10$ and to deliver the signal Vs, in accordance with FIG. 5, to two integrators 57 and 58. The integrator 57, which is an RC circuit, is connected by an impedance separator amplifier 60 with zero dB gain, to another integrator 59, which is also an RC circuit. The two integrators 57 and 59 are first order integrators.

The integrator 58 represented by an amplifier, is in fact an active band-pass filter (not shown) made with this amplifier. Its output is connected to another integrator 61 of the same type as the integrator 58, these two integrators being second order integrators. The integrator 58 has a gain of 1.2 dB and integrator 61 a gain of 7 dB. At the output of the integrators 59 and 61, a signal is obtained, which is proportional to the mean of the square of the value of the signal Ve, i.e. to the square of the true root-mean-square value of the signal Ve.

A linear amplifier 63 is connected to the output of the integrator 59, and a linear amplifier 62 is connected to the output of the integrator 61.

The output signal from the first integration chain (57, 59) is applied to two comparators 64, 65 for fast gain increment and decrement command and the output signal from the second integration chain (58, 61) is applied to two other comparators 66, 67 for slow gain increment and decrement command.

These four comparators receive from a reference voltage generator 88 four threshold voltages, with which are therefore compared, in two's, the output voltages of the two integration chains. Thus, at the output of the four comparators, logic level changes are obtained when the different thresholds are exceeded in one direction or the other.

Figure 6:
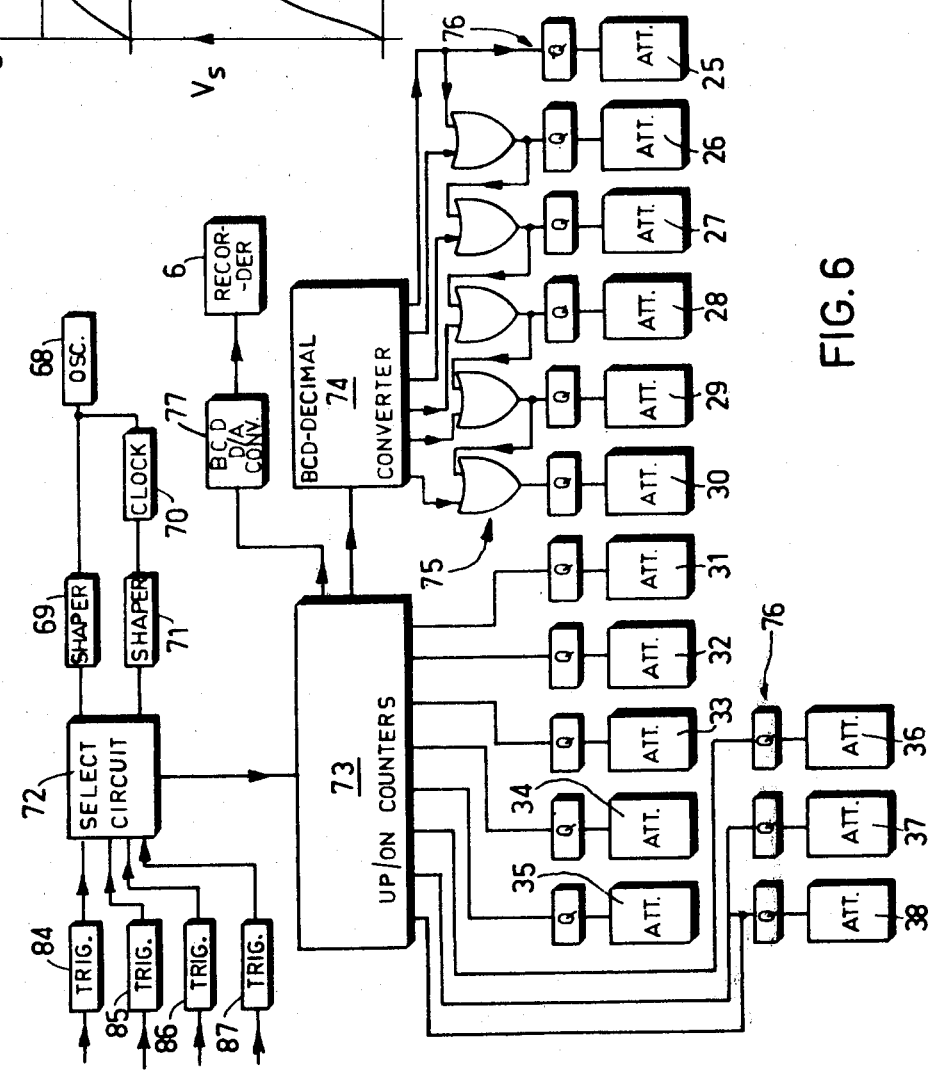
FIG. 6 shows a block diagram of the automatic gain control circuit of the device of FIG. 1.

The automatic gain control circuit 5 (FIG. 6) is intended to control automatically the switching of the attenuators 25 to 38 of the amplification chain 3, so as to maintain constant the output signals from the integration chains (57, 59) and (58, 61), and consequently the root-mean-square value of the signal at the output of the amplification chain 3.

Two clock circuits are provided to this end, a first clock circuit for the case of the signal to be measured suddenly varying considerably (fast response circuit), and a second clock circuit for the case of the signal to be measured varying slowly (slow response circuit). These two clock circuits comprise a common oscillator 68 delivering an output signal with rectangular pulses, of determined repetition frequency, for example 2800 Hz. The first clock circuit comprises a pulse shaper 69 composed in particular of an inverter and a logic NAND gate (not shown), converting the pulses of the oscillator 68 into negative pulses of short duration and of the same repetition frequency. The second clock circuit comprises a counter, used as frequency divider, for example by 10, followed by a flip-flop, used as divider by 2, the counter and the flip-flop being shown at 70 in FIG. 6, and a pulse shaper 71 composed in particular of inverters and of a NAND gate (not shown), converting the pulses from the divider 70 into positive pulses of short duration and of repetition frequency equal to that of the oscillator 68 divided, in the example in question, by 20, viz 140 Hz.

It is precisely in order to be able to switch the attenuators 25 to 38, as a function of the speed of variation of the signal to be measured, and to ensure a suitable response time and suitable stability, that there are provided in the squaring and integrating chain 4, two integration chains, respectively of the first order (57, 59) and of the second order (58, 62). Thus, for the case of a slow variation of the signal to be measured, it is one of the two comparators 66 and 67 which delivers attenuation variation signals and, for the case of a fast variation of the signal to be measured, it is one of the two comparators 64 and 65 which delivers, with priority as will be seen hereinafter, attenuation variations signals. To this end, the reference voltage generator 108 delivers a high threshold voltage and a low threshold voltage to each group of comparators (64, 66) and (65, 67).

For the case of a slow variation of the signal to be measured, the threshold comparator 66 may slowly increase the attenuation and the comparator 67 may decrease it slowly, and for the case of a fast variation of the signal to be measured, the threshold comparator 64 may rapidly increase the attenuation and the comparator 65 may decrease it rapidly. When the value of the signal delivered by the second order integration chain (58, 61) is lower than the slow decrement threshold, the comparator 67 delivers a signal for slow decrement of the attenuation, this increasing the level at the output of the amplification chain until the value of the integrated signal becomes higher than the slow decrement threshold again. When the value of the signal is higher than the slow increment threshold, the comparator 66 delivers a signal for slow increment of the attenuation, this reducing the level at the output of the amplification chain, until the value of the integrated signal becomes lower than the slow increment threshold again. When the value of the signal delivered by the first order integration chain (57, 59) is lower than the fast decrement threshold, the comparator 65 delivers a signal for fast decrement of the attenuation. At the same time, the comparator 67 supplies a signal for slow decrement of the attenuation. As will be seen hereinafter, it is the output signal of the comparator 65 which is taken into account with priority, as long as it is present, for the selection of that of the two clock signals corresponding to a fast variation of the signal to be measured. This will have for its effect to rapidly increase the level at the output of the amplification chain until the value of the signal integrated by the chain (57, 59) becomes higher than the fast decrement threshold again. The decrement in the attenuation is then controlled more slowly by the comparator 67 alone until the value of the signal integrated by the chain (58, 61) becomes higher than the slow decrement threshold again. Similarly, when the value of the signal integrated by the chain (57, 59) is higher than the fast increment threshold, the comparator 64 delivers a signal for fast increment of the attenuation. At the same time, the comparator 66 delivers a signal for slow increment of the attenuation. However, the fast increment signal is also taken into account, with priority, for the selection of that of the two clock signals corresponding to a fast variation of the signal to be measured. This has for its effect to rapidly reduce the level at the output of the amplification chain until the value of the signal integrated by the chain (57, 59) becomes lower than the fast increment threshold again. The increment of the attenuation is then controlled more slowly by the comparator 66 alone until the value of the signal integrated by the chain (58, 61) becomes lower than the slow increment threshold again.

Figure 7:
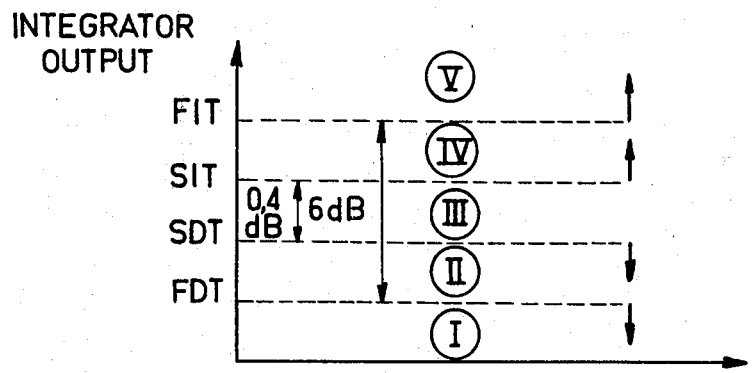
FIG. 7 shows the operating zones of the comparators of the chain of FIG. 4.

FIG. 7 shows the operating zones I of the comparator 65, I and II of the comparator 67, V of the comparator 64, and IV and V of the comparator 66, according to the value of the output signal from the squaring chain, the zones I to V corresponding respectively to a fast decrement, a slow decrement, a constant attenuation, a slow increment and a fast increment, the FIT value, shown on the Y-axis, signifying "fast increment threshold", SIT "slow increment threshold", SDT "slow decrement threshold" and FDT "fast decrement threshold".

In the example in question, these four threshold values are respectively equal to 9.888 V, 7.163 V, 6.841 V and 4.956 V, the difference, expressed in dE, between the two slow variation thresholds, being 0.4 dB, and between the two fast variation thresholds, 6 dB. This corresponds to level differences of 0.2 dB and 3 dB at the input of the device, in view of the presence of the quadrator.

The clock signals supplied by the two clock circuits (68, 69) and (68, 70, 71), corresponding respectively to a fast variation and a slow variation of the attenuation, are selected, as a function of the output signals delivered by the comparators 64 to 67 and shaped respectively by conventional triggers 84 to 87, in a selection circuit 72, to command a series of up-down counters 73, organized as systems of upcounting and downcounting, at a frequency determined by the selected clock signal.

Figure 8:
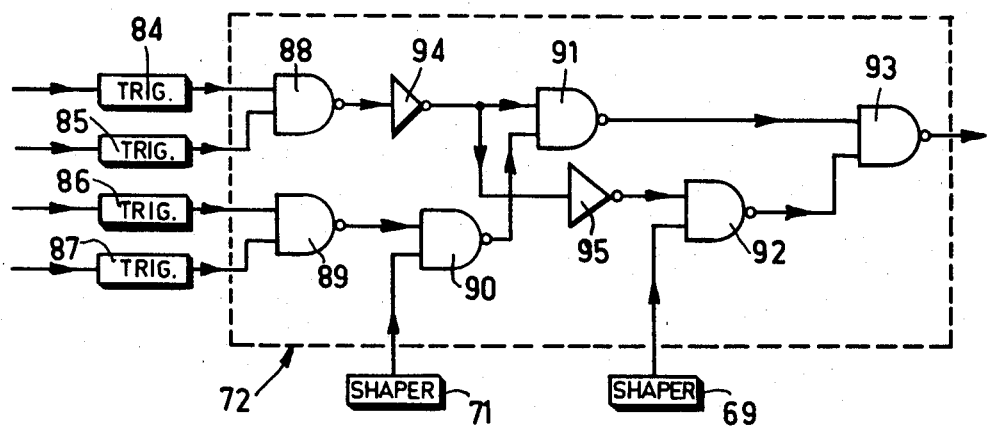
FIG. 8 shows a block diagram of a circuit for selecting one of the signals delivered by the clock circuits of the device of FIG. 1.

FIG. 8 shows the circuit 72 for selecting one of the two signals delivered by the clock circuits (68, 69) and (68, 70, 71). This circuit is a combination of six NAND gates 88 to 93 and two conventional inverters 94 and 95.

The NAND gate 88 receives on its two inputs the two signals delivered by the triggers 84, 85 for fast variation of the attenuation, and the NAND gate 89 receives on its two inputs the two signals delivered by the triggers 86, 87 for slow variation of the attenuation.

The gate 90 receives on one of its inputs the signal from the clock circuit (68, 70, 71) at slow frequency, and gate 92 receives on one of its inputs the signal from the clock circuit (68, 69) at fast frequency.

The output of the gate 93 controls the clock inputs of the series of counters 73.

Upon a slow variation of the signal to be measured, the gate 89 is "on" and the gate 90, which receives the output signal from the gate 89, allows the slow frequency signal from the clock circuit (68, 70, 71) to pass. The gate 88 is blocked, but due to the inverter 94, the gate 92 is "on". This gate 91 therefore allows the output signal from gate 90, i.e. the slow frequency clock signal, to pass. The gate 88 being blocked, the gate 92, which receives on one of its inputs the output signal of the gate 88 through the two inverters 94 and 95, therefore blocks the fast frequency signal from the clock circuit (68, 69). Consequently, upon a slow variation of the signal to be measured, the gate 91 and therefore gate 93 allow the slow frequency clock signal to pass.

Upon a fast variation of the signal to be measured, the gate 88 is "on", like gate 89. The gate 90 therefore allows the slow frequency clock signal to pass. However, as the inverter 94 is connected between the two NAND gates 88 and 91, the gate 91 is not "on" and thus blocks the slow frequency clock signal. One of the inputs of the gate 92 being connected to the output of the gate 88 via the two inverters 94 and 95, the gate 92 is "on" and therefore allows the fast frequency signal from the clock circuit (68, 69) to pass. Consequently, upon a fast variation of the signal to be measured, the gate 92 and therefore the gate 93 allow the fast frequency clock signal to pass with priority.

In the example in question, the series of counters 73 comprises, in series, a tenths of unit counter of capacity 1, a units counter of capacity 10, a tens counter of capacity 100, etc. according to the desired accuracy and desired extent of the range of variation.

The state of the counters therefore represents the level of attenuation, and this state is expressed in the BCD code.

The counters 73, of which the state is expressed in the BCD code, directly control the attenuators 31 to 36, of which the respective weightings of attenuation are already compatible with the BCD code, whilst they control the 10-dB attenuators 25 to 30 via a BCD-decimal converter 74, and a series of OR gates 75 associated respectively with the attenuators 25 to 30. In fact, the switching of power of all the attenuators 25 to 38 is effected via corresponding transistors 76.

It is the level of the state of the counters 73, of which the variation therefore represents the value of the signal to be measured, since the output signal from the amplification chain 3 is thus maintained constant, which is delivered to the recorder 6. The state of the counters 73 being expressed in the BCD code, and the recorder 6 functioning with analog input signals, the control of the recorder 6 is effected via a BCD digital-analog converter 77.

Thus, the use of the automatic gain control makes it possible for the squaring and integrating chain to function at a constant, or virtually constant, level, this considerably reducing the error due to the level variation which affects the functioning of the known devices. In addition, the device according to the invention has no logarithmic amplifier and the error which is due to the comparators 64 to 67 of the squaring and integrating chain 4 is much less than that of a logarithmic amplifier.

The accuracy of the device of the invention may, moreover, be further increased by providing in the amplification chain supplementary attenuators of finer attenuation, ranging for example from 0.01 dB to 0.08 dB. Finally, a device has been considered of which the dynamics is 60 dB. However, it is clear that no element of the device described hereinabove limits this dynamics and it may therefore be increased if desired. In this respect, a conventional device (not shown) is provided, adapted to block the counters 73 when the signal to be measured leaves the range of tolerable variation, so as to avoid the counters, further to their capacity being exceeded, continuing to count up or down the clock pulses, thus falsifying the measurement.

For purposes of facilitating an understanding of the present invention, a numerical example of the operation of the device is provided. For this example, the 60 dB range of the recorder 6 corresponds to a 0-6 volts range of the analog signal at the input terminal of the recorder. Further, the middle value of zone III (FIG. 7) of the thresholds of the comparators is 7.00 volts and the output signals of the integrators are adjusted to this value for a 1.4 volts r.m.s. voltage at the input of quadrator 56. With all of the attenuators switched off, the nominal amplification between the input of preamplification 2 and the input of the quadrator 56 is 123 dB, corresponding to the ratio of 1.4 volts to 1 micro volt. In addition, the device is utilized after a calibration is performed with the following conditions: The manual gain control 7 is set for 20 dB attenuation; a 1 milli volt r.m.s. signal is applied at the input of the preamplification chain, the signal frequency being between 150 Hz and 30 kHz; the recorder should then indicate 40 dB, and if not, the gain of the amplifier 54 is adjusted to set the recorder to this value. Under these conditions, the status of the device is as follows: The manual gain control 7 is utilized to switch on attenuators 11 and 13 of the preamplification chain to provide 20 dB attenuation; the signal level of the input of quadrator 56 is 1.4 volts r.m.s. and the input level at comparators 64–67 is 7.0 volts d.c., a situation whereby none of the comparators provides an upcounting or downcounting signal. Counters 73 are stopped with the BCD value of 40.0 at their output terminals and the output of BCD to decimal converter 74 is therefore at the value of 4. Attenuators 27, 28, 29 and 30 of the amplification chain are switched on via OR gates to provide 40 dB attenuation, while all other attenuators of the chain are switched off. The BDC digital to analog converter 77, which receives a BCD signal value 40.0 from counters 73, supplies a 4.0 volts analog signal to record 6, corresponding to a 40 dB mark on the recorder scale. The total attenuation is therefore 20 dB (attenuators 13 and 11) plus 40 dB (attenuators 27, 28, 29, 30) or 60 dB. This is the level expressed in decibels of the 1 milli volt r.m.s. input signal with reference to 1 micro volt r.m.s. The total amplification is then 123 dB−60 dB=63 dB, corresponding to the ratio between 1.4 volts and 1 milli volt.

If now the input signal level is increased, for example, by 2 dB, the level at the input terminal of quadrator 56 increases to 2 dB above 1.4 volts r.m.s. Because of the effects of voltage squaring, the level at the input terminals of the comparators 64–67 is 4 dB above 7 volts. This level is higher than the fast increment threshold so that comparator 64 supplies a fast upcounting signal, and the fact clock signal will be selected and supplied to counters 73. From the previous count 40.0, the count at counters 73 increases rapidly in 0.1 steps, switching on the corresponding attenuators 25–38 in the amplification chain. The attenuation in this chain increases in 0.1 dB steps, progressively reducing the signal level at the input of quadrator 56. When the level at this point is reduced to 1.5 dB above 1.4 volts r.m.s., the level at the input terminals of the comparators 64–67 reaches 3 dB above 7 volts, corresponding to the fast upcounting threshold (9.888 volts). Thereafter, the slow clock signal is selected and supplied to counters 73. Attenuation in the amplification chain continues to be increased until the signal at the input terminal of quadrator 56 is reduced to 1.4 volts r.m.s. The total attenuation of the amplification chain is then 42 dB, and the analog signal supplied to the quadrator is 4.2 volts, corresponding to the 42 dB mark on the recorder scale. The overall attenuation is 62 dB, equal to the level of the new input signal as referenced to 1 microvolt r.m.s.

If now, instead of having the input signal changed, the manual gain control is set to another position by the operator, the attenuation change in the preamplification chain is automatically compensated for by an opposite attenuation change in the amplification chain.

With a 1 milli volt r.m.s. input signal, if the manual gain control 7 is set for 0 dB attenuation in the preamplification chain, the attenuation in the amplification chain increases to 60 dB, driving the recorder to full scale. In this case, the 60 dB range of the recorder 6 corresponds to input signals ranging from 1 microvolt to 1 millivolt. If the calibration conditions described above, with a 20 dB attenuation in the preamplification chain, the 60 dB range of recorder 6 corresponds to input signals ranging from 10 microvolts to 10 milli volts, with a 1 milli volt signal corresponding to the 40 dB mark. Thus, the 60 dB range of the recorder may be shifted within the overall 120 dB range of the device.

The device of the invention is particularly well adapted to measuring a variable signal, particularly a noise, particularly as a function of time, or of another parameter, such as, for example, a bearing. The recorder 6 is then advantageously a graphic recorder, with an XY table, and the value of the signal is then shown directly on the Y axis in dB, with a linear graduation. In this case, the movement of the pen of the recorder is controlled in known manner along the X and Y axes, the movement along the Y axis consequently being controlled by the device of the invention.

In the example in question the tolerable variation range at the input of the sensor extends from 1 μV r.m.s. to 1 V r.m.s., that is over 120 dB, and the signal may have a crest factor greater than 5. The linearity of the recording is better than ±0.5-dB over the 120-dB range.

What is claimed is:

1. In a device for measuring, with logarithmic conversion, the level of a variable signal delivered by a sensor, comprising an amplification chain made up of a series of attenuators receiving the signal delivered by the sensor, a squaring and integrating chain for effecting the conversion of the value of the signal delivered by the amplification chain into its mean-square value, and a recorder for recording the level of the signal to be measured, characterized in that said attenuators are calibrated in dB and the device further comprises an automatic gain control circuit for receiving the output signal from the squaring and integrating chain and generating a digital control signal used to switch said attenuators in order to maintain constant the mean-square value of the output signal from said amplification chain and consequently the output signal of said squaring and integrating chain and a digital to analog converter for receiving an output signal from the automatic gain control circuit and generating an analog signal, said recorder recording said analog signal.

2. The device of claim 1, wherein are provided a manual gain control circuit and a preamplification chain connected between said sensor and said amplification chain and comprising attenuators which may be switched by said manual gain control circuit, whereby the recorder range may be shifted within the overall range of the device if the latter range is larger.

3. The device of claim 1, wherein said automatic gain control circuit comprises two clock circuits at respectively high and low frequencies, a series of up-down counters organized as an upcounting and downcounting system, driven by said clock circuits, the output of the counters providing said control signal which is recorded and simultaneously used to switch said attenuators of said amplification chain, and a selection circuit, controlled by the output of said squaring and integrating chain, for selecting one of said clock circuits as a function of the amplitude of variation of the variable input signal to be measured.

4. The device of claim 3, wherein said counters are BCD counters and said automatic gain control circuit comprises a BCD-decimal converter receiving the output signal from said series of counters and a series of OR gates receiving the output signals of said converter to switch a part of said attenuators.

5. The device of claim 3, wherein said squaring and integrating chain comprises a generator generating reference voltages and a first and second groups of comparators controlling said selection circuit of said automatic gain control circuit, said comparators comparing the mean-square value of the input signal to be measured, to said reference voltages from said generator in such a way that the comparators of said first group of comparators provide signals corresponding to large variations of the input signal amplitude for selection of said high frequency clock circuit for fast gain control, while the comparators of said second group of comparators provide signals corresponding to small variations of the input signal amplitude for selection of said low frequency clock circuit for slow and more accurate gain control, the result being that the comparators of said first group of comparators will generate large variations of attenuation through said attenuators in said amplification chain, while the comparators of said second group of comparators will generate small variations of attenuation through said attenuators.

6. The device of claim 3, wherein said up-down counters are BCD up-down counters and wherein a BCD digital to analog converter, receiving the output signal from said up-down counters provides an analog signal which is recorded by said recorder, whereby, after calibration with an input signal of selected and known root-mean-square voltage, the status of said up-down counters represents, in dB, relatively to the root-mean-square value of the calibration signal, the root-mean-square value of the variable input signal, this root-mean-square value being recorded by said recorder.

7. The device of claim 5, wherein said squaring and integrating chain comprises two integration chains of the first order and of the second order, respectively, driving said first and said second of said groups of comparators, respectively.

8. The device of claim 5, wherein each of the said groups of comparators comprises a first comparator intended to deliver a signal for increasing the attenuation and a second comparator intended to deliver a signal for decreasing the attenuation.

* * * * *